United States Patent
Hui et al.

(10) Patent No.: US 8,698,149 B2
(45) Date of Patent: Apr. 15, 2014

(54) LIQUID CRYSTAL DISPLAY AND ARRAY SUBSTRATE

(75) Inventors: Guanboa Hui, Beijing (CN); Seungjin Choi, Beijing (CN); Feng Zhang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 14 days.

(21) Appl. No.: 13/457,825

(22) Filed: Apr. 27, 2012

(65) Prior Publication Data

US 2012/0273789 A1 Nov. 1, 2012

(30) Foreign Application Priority Data

Apr. 29, 2011 (CN) .................. 2011 2 0136037 U

(51) Int. Cl.
*H01L 31/00* (2006.01)
(52) U.S. Cl.
USPC .................. 257/59; 57/E29.069; 57/E29.273; 57/E29.296; 57/E21.459; 57/E21.413
(58) Field of Classification Search
None
See application file for complete search history.

(56) References Cited

U.S. PATENT DOCUMENTS

| | | | | |
|---|---|---|---|---|
| 4,624,737 | A * | 11/1986 | Shimbo | 438/158 |
| 6,259,119 | B1 * | 7/2001 | Ahn et al. | 257/72 |
| 6,288,414 | B1 | 9/2001 | Ahn | |
| 2001/0019126 | A1 * | 9/2001 | Kim | 257/59 |
| 2005/0052604 | A1 | 3/2005 | Kim et al. | |
| 2006/0146255 | A1 | 7/2006 | Ahn | |
| 2007/0263132 | A1 | 11/2007 | Yang | |
| 2008/0035999 | A1 | 2/2008 | Kim | |
| 2009/0284677 | A1 * | 11/2009 | Shin et al. | 349/46 |

FOREIGN PATENT DOCUMENTS

| | | |
|---|---|---|
| EP | 1 813 979 A2 | 8/2007 |
| KR | 100190023 B1 | 6/1999 |
| KR | 100307385 B1 | 8/2001 |
| KR | 1020060074325 A | 7/2006 |

OTHER PUBLICATIONS

Extended European Search Report dated Mar. 19, 2013; Appln. 12166015.3-1903/2518558.
KIPO Office Action dated Aug. 21, 2013; Appln. No. 10-2012-0044639.

* cited by examiner

*Primary Examiner* — Andy Huynh
*Assistant Examiner* — Juanita B Rhodes
(74) *Attorney, Agent, or Firm* — Ladas & Parry LLP

(57) ABSTRACT

An embodiment of the disclosed technology discloses an array substrate comprising: a base substrate; a first layer transparent common electrode formed on the base substrate; a gate metal common electrode formed on the first layer transparent common electrode; an insulation layer formed on the gate metal common electrode, with via holes being formed in the insulation layer; and a second layer transparent common electrode formed on the insulation layer. A side portion of via holes is in contact with the gate metal common electrode, another side portion is in contact with the first layer transparent common electrode, such that the second layer transparent common electrode is connected electrically with the first layer transparent common electrode and the gate metal common electrode in the via holes.

14 Claims, 3 Drawing Sheets

LIQUID CRYSTAL DISPLAY AND ARRAY SUBSTRATE

CROSS REFERENCE TO RELATED APPLICATIONS

This application claims the benefit of Chinese Patent Application No. 201120136037.9 filed Apr. 29, 2011, the entire disclosure of which is incorporated by reference herein.

BACKGROUND

Embodiments of the disclosed technology relate to a liquid crystal display (LCD) and an array substrate.

Thin film transistor liquid crystal displays (TFT-LCDs) have the characteristics of small volume, low power consumption, no radiation and so on, and have prevailed in the present market of flat displays. However, liquid crystal displays have the disadvantage of relatively narrow viewing angle, thus the manufacturers developed various wide viewing angle technologies. Among the wide viewing angle technologies, advanced-super dimensional switching technology (AD-SDS) forms a multi-dimensional electric field including a parallel electric field generated between the sides (edge portions) of the pixel electrodes within a same plane and a longitudinal electric field generated between the pixel electrode layer and the common electrode layer on different layers, which enables all liquid crystal molecules between the pixel electrode and above the electrodes within the liquid crystal cell to rotate so as to enhance the work efficiency of the plane orientation liquid crystal and increase light transmittance. AD-SDS technology can be used to improve the display quality of TFT-LCDs, and has the advantages of high transmittance, wide viewing angle, high aperture ratio, low color aberration, small response time, no push Mura, etc.

In order to reduce production cost, the number of mask processes (i.e., the number of the mask used or the number of photolithography process) was reduced during the preparation process of the TFT-LCD array substrates of the AD-SDS type. Presently, manufacturers are actively developing 4-mask process to prepare the TFT-LCD array substrates of the AD-SDS type. As shown in FIGS. 1, 2 and 3, a conventional method comprises the following processes. The first mask process: a first transparent electrode layer and a gate metal layer are deposited on a glass substrate 1, exposure is conducted with a gray scale mask plate in a gray scale mask process, and etching, ashing, and removing processes are conducted to form the first layer transparent common electrode 2, a gate metal line 3 (including gate electrode (Gate)), two gate metal common electrodes (the gate metal common electrode 11' in one row and the gate metal common electrode 12' in a previous row). The second mask process: on the formed pattern described above, a gate insulation layer, a semiconductor layer, a doped semiconductor layer and a source/drain metal layer are sequentially deposited, then exposure is conducted with a gray scale mask plate in using a gray scale mask process, and etching, ashing, and removing processes are conducted to form a gate insulation layer 4, a semiconductor layer 5 (semiconductor active silicon island), a doped semiconductor layer 6 and a source/drain metal layer 7 (including source electrodes, drain electrodes, and data lines). The third mask process: a passivation insulation layer 8 (via hole layer) is deposited on the source/drain metal layer 7 and covers the entire glass substrate 1, and then via holes 10' and 14' are formed in the passivation insulation layer 8 by the process of exposure and etching. The fourth mask process: a transparent electrode layer is deposited on the substrate, a second layer of transparent pixel electrode 9 and a second layer transparent common electrode 13 are formed by the process of exposure and etching with a gray scale mask process. The pixel electrode 9 is connected with one of the source and drain electrodes by the via hole 10'; the second layer transparent common electrode 13 is connected with both the common electrodes 11' and 12' in two adjacent pixel rows by via holes 14'. In the area connecting the common voltage signals of the pixels in the present and previous lines (as shown in FIG. 3), the cross-section of via holes 14' is U-shaped or square-shaped, the bottom side is in contact with the gate metal common electrodes 11', 12', under which the first layer transparent common electrode 2 is formed and not in contact with the via hole 14'.

The conventional technology employs amorphous indium tin oxide (a-ITO) thin film in preparing the first layer transparent common electrode with a gray scale mask plate; when the film for forming the next gate insulation layer 4 is deposited, the temperature is typically of above 300 degree Celsius. The a-ITO thin film will undergo a crystallization reaction under such a high temperature and be converted into polycrystalline indium tin oxide (p-ITO) thin film. Since the crystal grains of p-ITO are different in size from those of the gate metal common electrode 11', 12', it will result in strip and delamination between the first layer transparent common electrode 2 and the gate metal common electrode 11', 12' during the course of a-ITO being converted into p-ITO (as shown in FIG. 4), and cracks or gaps 15 appear. Such gaps 15 can cause poor contact, thus the voltage signals over the gate metal common electrode 11', 12' can not be transferred to the first layer transparent common electrode 2 effectively, such that in the adjacent pixel rows, the first layer transparent common electrode of the previous pixel row and the first layer transparent common electrode of the present pixel row can not work normally, which results in the abnormality of the pixel operation and affects the display effect and display quality.

SUMMARY

An embodiment of the disclosed technology provides an array substrate comprising: a base substrate; a first layer transparent common electrode formed on the base substrate; a gate metal common electrode formed on the first layer transparent common electrode; an insulation layer formed on the gate metal common electrode, with via holes being formed in the insulation layer; and a second layer transparent common electrode formed on the insulation layer; wherein a side portion of via holes is in contact with the gate metal common electrode, another side portion is in contact with the first layer transparent common electrode, such that the second layer transparent common electrode is connected electrically with the first layer transparent common electrode and the gate metal common electrode in the via holes.

Another embodiment of the disclosed technology provides a liquid crystal display which comprises the above-mentioned array substrate.

In the above embodiments, the gate metal common electrode is shorten on one side to be located below the via holes; a portion of the bottom of each via hole after photolithography is in contact with the gate metal common electrode, and another portion is in contact with the first layer transparent common electrode. Therefore, the voltage signals over the gate metal common electrode can be transferred to the first layer transparent common electrode through the second layer transparent common electrode, which is in contact with the first layer transparent common electrode, in the bottom of the via holes, even if strip and delamination occur between the first layer transparent common electrode and the gate metal common electrode, so as to ensure the common electrode signals of the pixels in adjacent two rows can be transferred normally and the pixels are able to be displayed normally, which ensures the display effect of the liquid crystal display and improve the display quality.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

The specific implementation of the disclosed technology will be further described below in detail in conjunction with the drawings and embodiments. The following embodiments are used to illustrate the technical solution of the disclosed technology, but not limiting the scope of the disclosed technology.

Figure 1:
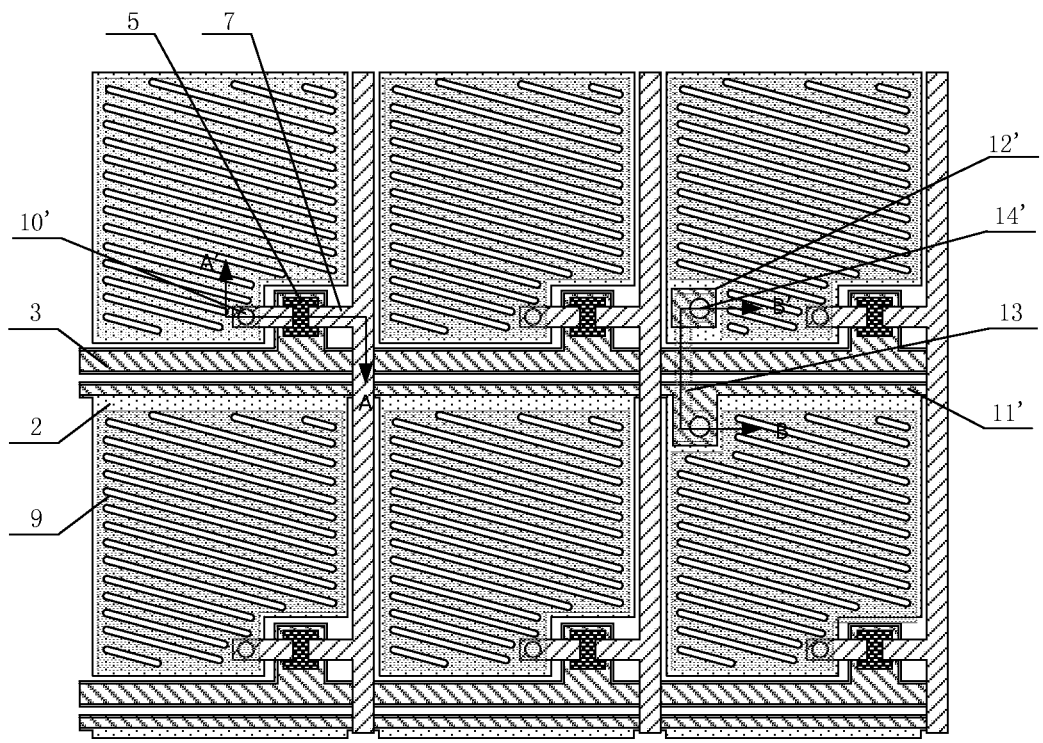
FIG. 1 is a top view of a liquid crystal display array substrate in conventional technology.
Figure 2:
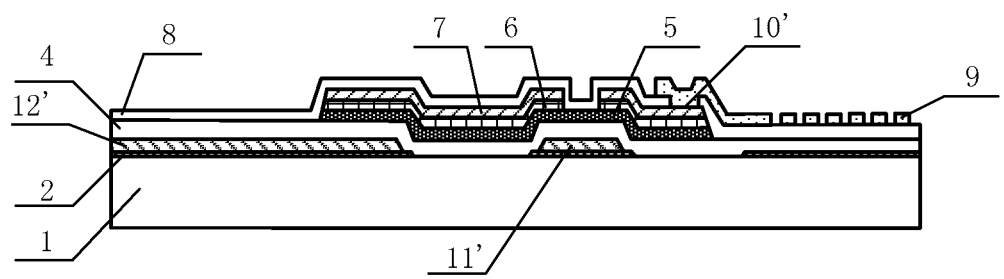
FIG. 2 is a cross-sectional view of FIG. 1 taken from A'-A.
Figure 3:
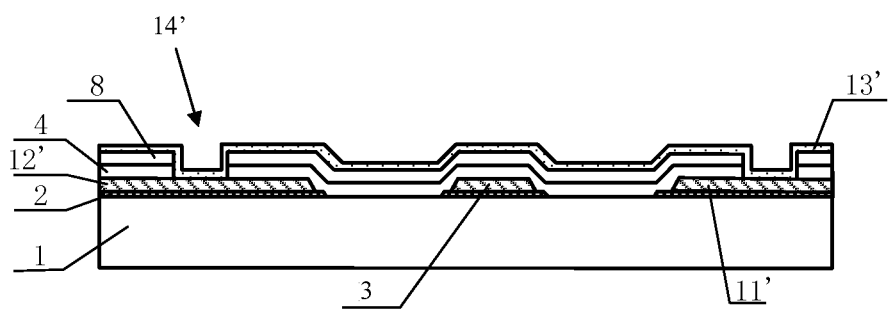
FIG. 3 is a cross-sectional view of FIG. 1 taken from B'-B.
Figure 4:
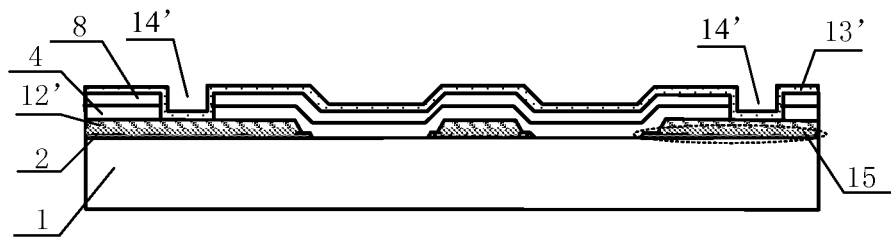
FIG. 4 is a cross-sectional view of FIG. 1 taken from B'-B, which shows appearance of abnormality.
Figure 5:
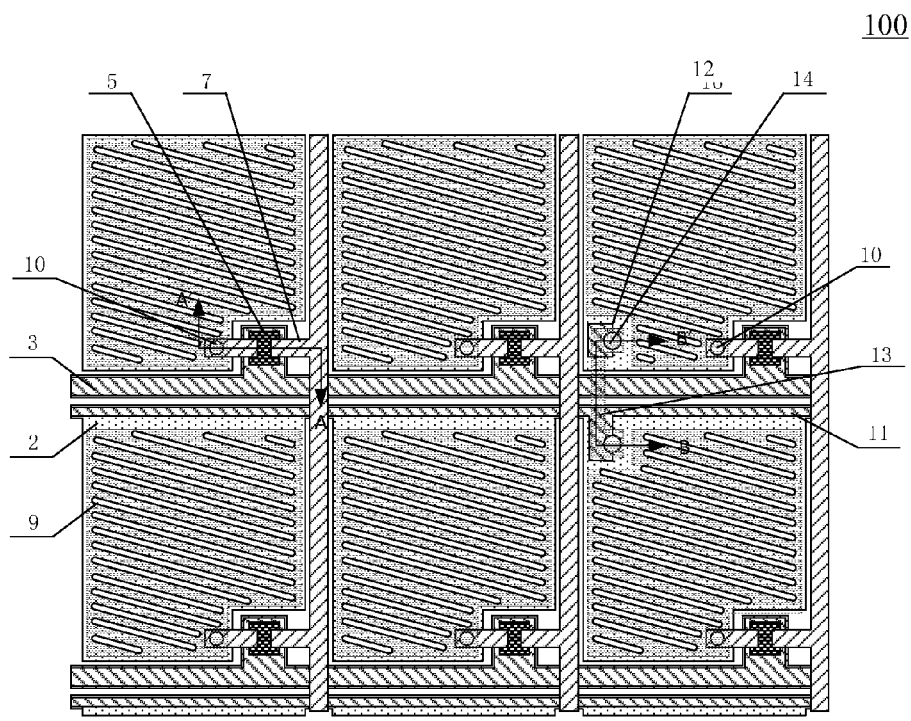
FIG. 5 is a top view of a liquid crystal display array substrate according to an embodiment of the disclosed technology.
Figure 6:
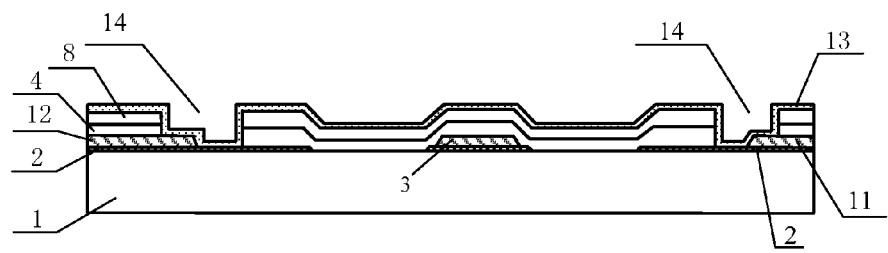
FIG. 6 is a cross-sectional view of FIG. 5 taken from B'-B.

FIG. 5 and FIG. 6 are respectively the top view and the cross-sectional view of a liquid crystal display array substrate of an embodiment of the disclosed technology. This array substrate 100 comprises: a base substrate 1 which is a glass substrate 1 in this embodiment, a first layer transparent common electrode 2 is formed on the glass substrate 1, and gate metal common electrodes 11, 12 are formed on the first layer transparent common electrode 2. The gate metal common electrode 11 is located in one pixel line, while the gate metal common electrode 12 is located in the upper adjacent pixel line. An insulation layer 4, 8 is formed on the gate metal common electrode 11, 12, and the insulation layer is provided with via holes 14 therein. One side portion of at least one via hole 14 is in contact with the gate metal common electrode (11 or 12), and the other side portion is in contact with the first layer transparent common electrode 2. One side of the gate metal common electrode 11 is aligned and overlapped with the first layer transparent common electrode 2, the other side extends to under the lower side of the via hole 14 at the common electrode; one side of the gate metal common electrode 12 in the upper adjacent row is aligned and overlapped with the first layer transparent common electrode 2, and the other side extends to under the lower side of another via hole 14 at the common electrode. A second layer transparent common electrode 13 is formed on the insulation layer, the second layer transparent common electrode 13 is in contact with the gate metal common electrodes 11, 12 through side portions of via holes 14, and another side portion of the common electrode 13 is in contact with the first layer transparent common electrode 2, thus electrically connecting the gate metal common electrode 11 and 12.

The insulation layer above the gate metal common electrode 11, 12 comprises a gate insulation layer 4 which is formed on the gate metal common electrode 11 and a passivation insulation layer 8 which is formed on the gate insulation layer 4. The via holes 14 are formed through the passivation insulation layer 8 and the gate insulation layer 4.

On each side of the gate metal line 3 one via hole 14 is formed. These two via holes 14, for example, are provided symmetrically on both sides of the gate metal line 3. The bottom of the at least one via hole 14 is formed in a step-like shape as shown in FIG. 5.

For one via hole 14, as shown in FIG. 5, a side portion and a part of the bottom of the via hole are in contact with the gate metal common electrode 11, and the other part of the bottom is in contact with the first layer transparent common electrode 2. A side portion and a part of the bottom of another via hole 14 are in contact with the gate metal common electrode 12 in the upper row, and the other part of the bottom is in contact with the first layer transparent common electrode 2.

Or, for one via hole 14, a side portion of the via hole is in contact with the gate metal common electrode 11, and the bottom of it is in contact with the first layer transparent common electrode 2; for the other via hole 14, a side portion of the via hole is in contact with the gate metal common electrode 12 in the upper row, and the bottom of it is in contact with the first layer transparent common electrode 2.

In preparing the above array substrate, taking the via hole 14 as an example, in the first-time gray scale mask process, the transparent common electrode layer and the gate metal layer are deposited sequentially on the glass substrate 1, and the stacked layers of the transparent common electrode layer and the gate metal layer described above are patterned with the process of photolithography to form the first layer transparent common electrode 2 and the gate metal common electrodes 11, 12 on the first layer transparent common electrode 2. In the area connecting the common voltage signals of the pixels in the upper and lower adjacent lines, the gate metal common electrodes 11, 12 are formed to extend to under the lower side corresponding to the positions of the via holes 14 in the subsequent photolithography progress with a gray scale mask. The via holes 14 are formed by etching through the insulation layers 4, 8 till the first layer transparent common electrode 2. In this way, even if the strip and delamination occur between the first layer transparent common electrode 2 and the gate metal common electrodes 11, 12, the voltage signals over the gate metal common electrodes 11,12 can be transferred to the first layer transparent common electrode 2 through the second layer transparent common electrode 13 at the bottom of the via holes 14, which is in contact with the first layer transparent common electrode 2, so as to ensure the first layer transparent common electrodes 2 of the adjacent pixels to work normally and the pixels can display normally, which ensures the display effect of the liquid crystal display and improve the display quality.

The liquid crystal display according to the embodiment of the disclosed technology comprises an array substrate according to any one of the above-described array substrates of the disclosed technology, and may further comprise other components such as a color filter substrate, a backlight module, driving circuits, etc. The liquid crystal display can be applied to TV sets, mobile phones, computers, and the like.

The embodiment of the disclosed technology being thus described, it will be obvious that the same may be varied in many ways. Such variations are not to be regarded as a departure from the spirit and scope of the disclosed technology, and all such modifications as would be obvious to those skilled in the art are intended to be included within the scope of the following claims.

What is claimed is:

1. An array substrate comprising:
    a base substrate;
    a first layer transparent common electrode formed in a pixel on the base substrate;
    a gate metal common electrode formed on the first layer transparent common electrode;
    an insulation layer formed on the gate metal common electrode, with via holes being formed in the insulation layer; and
    a second layer transparent common electrode formed on the insulation layer;
    wherein a side portion of the via holes is in contact with the gate metal common electrode, another side portion is in contact with the first layer transparent common electrode, such that the second layer transparent common electrode is connected electrically with the first layer transparent common electrode and the gate metal common electrode in the via holes.

2. The array substrate according to claim 1, wherein the insulation layer comprises: a gate insulation layer formed on the gate metal common electrode and a passivation insulation layer formed on the gate insulation layer.

3. The array substrate according to claim 1, wherein a bottom of at least one of the via holes is formed in a step-like shape.

4. The array substrate according to claim 2, wherein a bottom of at least one of the via holes is formed in a step-like shape.

5. The array substrate according to claim 1, wherein the gate metal common electrode is in contact with a side portion and a part of a bottom of the corresponding via hole, and the first layer transparent common electrode is in contact with the other part of the bottom of the via hole.

6. The array substrate according to claim 2, wherein the gate metal common electrode is in contact with a side portion and a part of a bottom of the corresponding via hole, and the first layer transparent common electrode is in contact with the other part of the bottom of the via hole.

7. The array substrate according to claim 3, wherein the gate metal common electrode is in contact with a side portion and a part of the bottom of the corresponding via hole, and the first layer transparent common electrode is in contact with the other part of the bottom of the via hole.

8. The array substrate according to claim 1, wherein the gate metal common electrode is in contact with a side portion of the corresponding via hole, and the first layer transparent common electrode is in contact with a bottom of the via hole.

9. The array substrate according to claim 2, wherein the gate metal common electrode is in contact with a side portion of the corresponding via hole, and the first layer transparent common electrode is in contact with a bottom of the via hole.

10. The array substrate according to claim 1, wherein the gate insulation layer includes one via hole at the either side of each gate metal line.

11. The array substrate according to claim 2, wherein the gate insulation layer has one via hole at the either side of each gate metal line.

12. The array substrate according to claim 3, wherein the gate insulation layer has one via hole at the either side of each gate metal line.

13. The array substrate according to claim 3, wherein the bottoms of both via holes in two adjacent rows are formed in a step-like shape.

14. A liquid crystal display, comprising an array substrate which comprises:
    a base substrate;
    a first layer transparent common electrode formed in a pixel on the base substrate;
    a gate metal common electrode formed on the first layer transparent common electrode;
    an insulation layer formed on the gate metal common electrode, with via holes being formed in the insulation layer; and
    a second layer transparent common electrode formed on the insulation layer;
    wherein a side portion of the via holes is in contact with the gate metal common electrode, another side portion is in contact with the first layer transparent common electrode, such that the second layer transparent common electrode is connected electrically with the first layer transparent common electrode and the gate metal common electrode in the via holes.

* * * * *

UNITED STATES PATENT AND TRADEMARK OFFICE
CERTIFICATE OF CORRECTION

| | | |
|---|---|---|
| PATENT NO. | : 8,698,149 B2 | Page 1 of 1 |
| APPLICATION NO. | : 13/457825 | |
| DATED | : April 15, 2014 | |
| INVENTOR(S) | : Guanbao Hui et al. | |

It is certified that error appears in the above-identified patent and that said Letters Patent is hereby corrected as shown below:

Title Page, Item (75)

Delete "Guanboa Hui" and insert --Guanbao Hui--

Signed and Sealed this
Fourteenth Day of April, 2015

Michelle K. Lee
*Director of the United States Patent and Trademark Office*